United States Patent
Dolson

(10) Patent No.: US 7,564,399 B2
(45) Date of Patent: Jul. 21, 2009

(54) SHIELDED COMPARTMENT FOR MOUNTING A HIGH FREQUENCY RADAR COMPONENT ON A PRINTED CIRCUIT BOARD

(75) Inventor: Micheal Dolson, Millbrook (CA)

(73) Assignee: Siemens Milltronics Process Instruments, Inc., Peterborough (CA)

( * ) Notice: Subject to any disclaimer, the term of this patent is extended or adjusted under 35 U.S.C. 154(b) by 225 days.

(21) Appl. No.: 11/529,457

(22) Filed: Sep. 28, 2006

(65) Prior Publication Data

US 2007/0103361 A1    May 10, 2007

(30) Foreign Application Priority Data

Sep. 28, 2005  (EP) .................................. 05021185

(51) Int. Cl.
*G01S 13/08* (2006.01)
(52) U.S. Cl. ..................... 342/124; 342/4; 333/219.1
(58) Field of Classification Search .................. 342/1–4
See application file for complete search history.

(56) References Cited

U.S. PATENT DOCUMENTS

| 5,392,051 | A  | * | 2/1995 | Uematsu et al. | ............. 342/165 |
| 6,449,153 | B1 | * | 9/2002 | James | ........................ 361/704 |
| 2004/0056736 | A1 | * | 3/2004 | Enokihara et al. | ........... 333/202 |
| 2005/0151215 | A1 | * | 7/2005 | Hauhe et al. | ................. 257/421 |

FOREIGN PATENT DOCUMENTS

| JP | 63 204914 | 8/1988 |
| JP | 08 138847 | 5/1996 |

* cited by examiner

*Primary Examiner*—Thomas H Tarcza
*Assistant Examiner*—Timothy A Brainard

(57) ABSTRACT

The shielded mounting module comprises a cover member and a box member. The box member includes a plurality of bosses formed in the bottom surface. Each of the bosses provide an electrical contact point and are soldered to corresponding electrical pads on a circuit board, for example, grounded pads on the circuit board. The bosses also serve as stand-offs or spacers to mount the module above the surface of the circuit board. In another embodiment, the bosses are formed as a pair of rails.

14 Claims, 3 Drawing Sheets

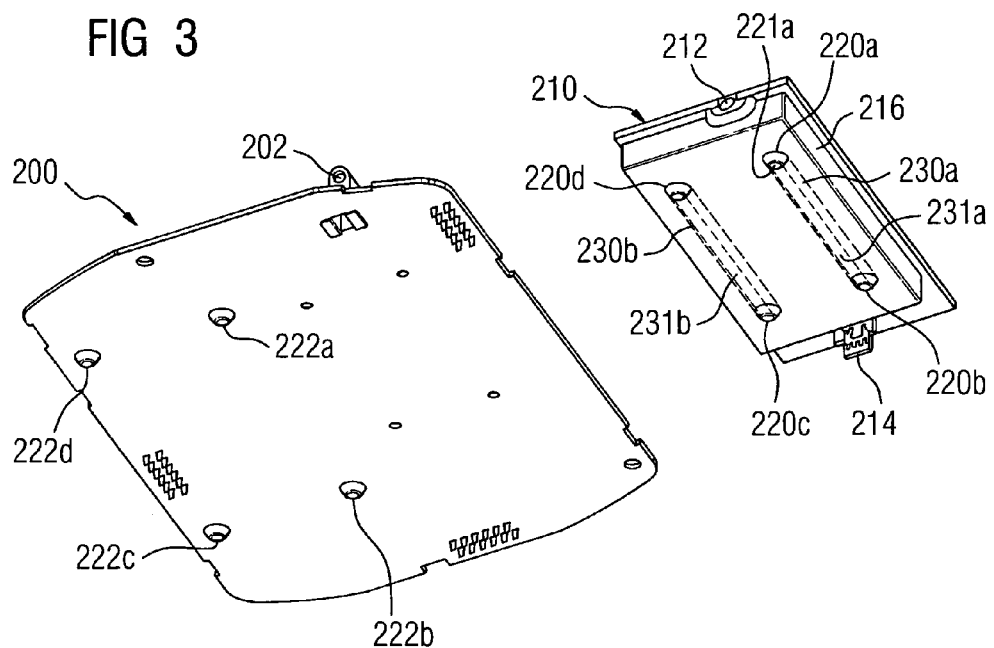
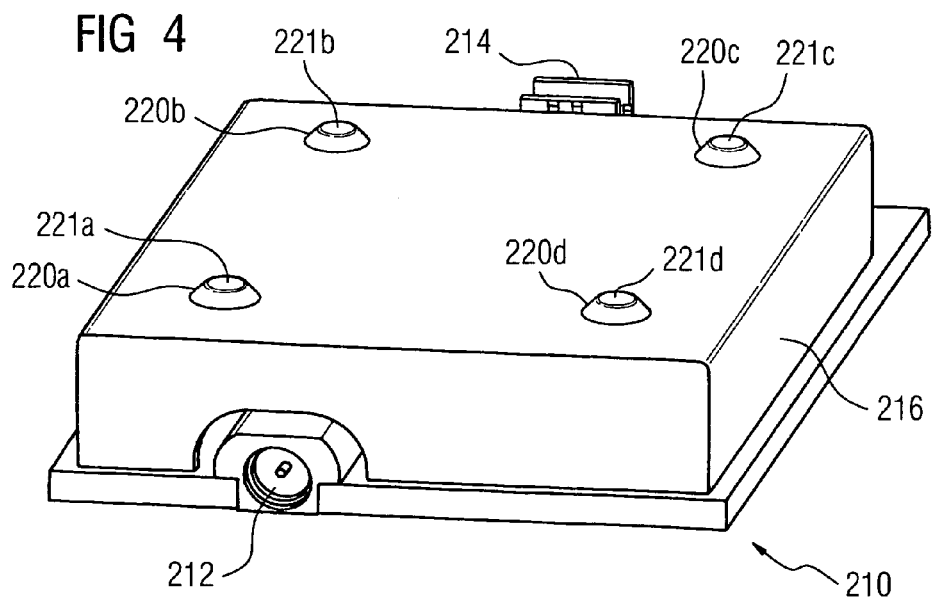

SHIELDED COMPARTMENT FOR MOUNTING A HIGH FREQUENCY RADAR COMPONENT ON A PRINTED CIRCUIT BOARD

CROSS REFERENCE TO RELATED APPLICATIONS:

This application claims priority of European application No. 05021185.3 EP filed Sep. 28, 2005, which is incorperated by reference herein in its entirety.

FIELD OF THE INVENTION

The present invention relates to a shielded compartment for mounting a high frequency radar component on a printed circuit board. Such radar components are constituent parts of level measurement devices.

BACKGROUND OF THE INVENTION

Time of flight ranging systems find use in level measurements applications, and are commonly referred to as level measurement systems. Level measurement systems determine the distance to a reflective surface (i.e. reflector) by measuring how long after transmission energy, an echo is received. Such systems may utilize ultrasonic pulses, pulse radar signals, or other microwave energy signals.

Pulse radar and microwave-based level measurement systems are typically preferred in applications where the atmosphere in the container or vessel is subject to large temperature changes, high humidity, dust and other types of conditions which can affect propagation. The high frequency nature of such systems make them less susceptible to signal degradation due to the effects of humidity, dust and the like in the operating environment.

Level measurement devices may also utilize a FMCW radar transmitter system. A FMCW radar level transmitter system transmits a continuous signal during the measurement process. The frequency of the signal increases or decreases linearly with time so that when the signal has travelled to the reflective surface and back, the received signal is at a different frequency to the transmitted signal. The frequency difference is proportional to the time delay and to the rate at which the transmitted frequency was changing. To determine the distance that the reflector is away from the radar transmitter, it is necessary to analyze the relative change of the received signal with respect to the transmitted signal as will be appreciated by those skilled in the art.

Pulse radar, microwave and FMCW radar based level measurement systems include electronics and circuitry which operate under high and/or very high frequencies as described above. Electronic circuitry operating at high frequencies requires shielding to eliminate or minimize the unwanted effects of high frequency signals or signal processing, such as EMI (electromagnetic interference). Shielding techniques or mechanisms are a typical requirement in the design of high frequency circuitry. Accordingly, there remains a need for improvements in high frequency design components or elements for radar-based level measurement systems.

BRIEF SUMMARY OF THE INVENTION

The present invention provides a shielded compartment for mounting a high frequency radar component on a printed circuit board as defined in the claims.

Preferable embodiments of the shielded compartment according to the invention are specified in the remaining claims.

In a first aspect, the present invention provides a level measurement apparatus for determining a level measurement for a material contained in a vessel, the level measurement apparatus comprises: an antenna; a housing, the housing has a connection port for connecting the antenna to the housing; a carrier, the carrier is mounted in the housing; electronic circuitry, the electronic circuitry has a port for coupling to the antenna and a high frequency stage for driving the antenna; the carrier has a surface for mounting the electronic circuitry; a shielded mount for mounting the high frequency stage; the shielded mount has one or more integrated electrical contact and mounting points for securing the shielded mount to the carrier.

In another aspect, the present invention provides a shielded compartment for mounting a high frequency radar component on a printed circuit board for a level measurement instrument, the shielded compartment comprises: a cover member formed from a conductive material; a box member formed from a conductive material and having a bottom member and a plurality of side members, the bottom member and the side members forming a cavity for the high frequency radar component; the bottom member including a plurality of mounting elements for mounting the shielded compartment to the printed circuit board; the mounting elements being formed in the bottom member of the box member.

Other aspects and features of the present invention will become apparent to those ordinarily skilled in the art upon review of the following description of specific embodiments of the invention in conjunction with the accompanying drawings.

BRIEF DESCRIPTION OF THE DRAWINGS

Reference is now made to the accompanying drawings which show, by way of example, embodiments of the present invention and in which:

FIG. 3 shows in diagrammatic form the shielded mounting module detached from the printed circuit board module of FIG. 2; and FIG. 4 shows in isolation the shielded mounting module according to the present invention.

In the drawings, like references or characters indicate like elements or components.

DESCRIPTION OF EMBODIMENTS OF THE INVENTION

Figure 1:
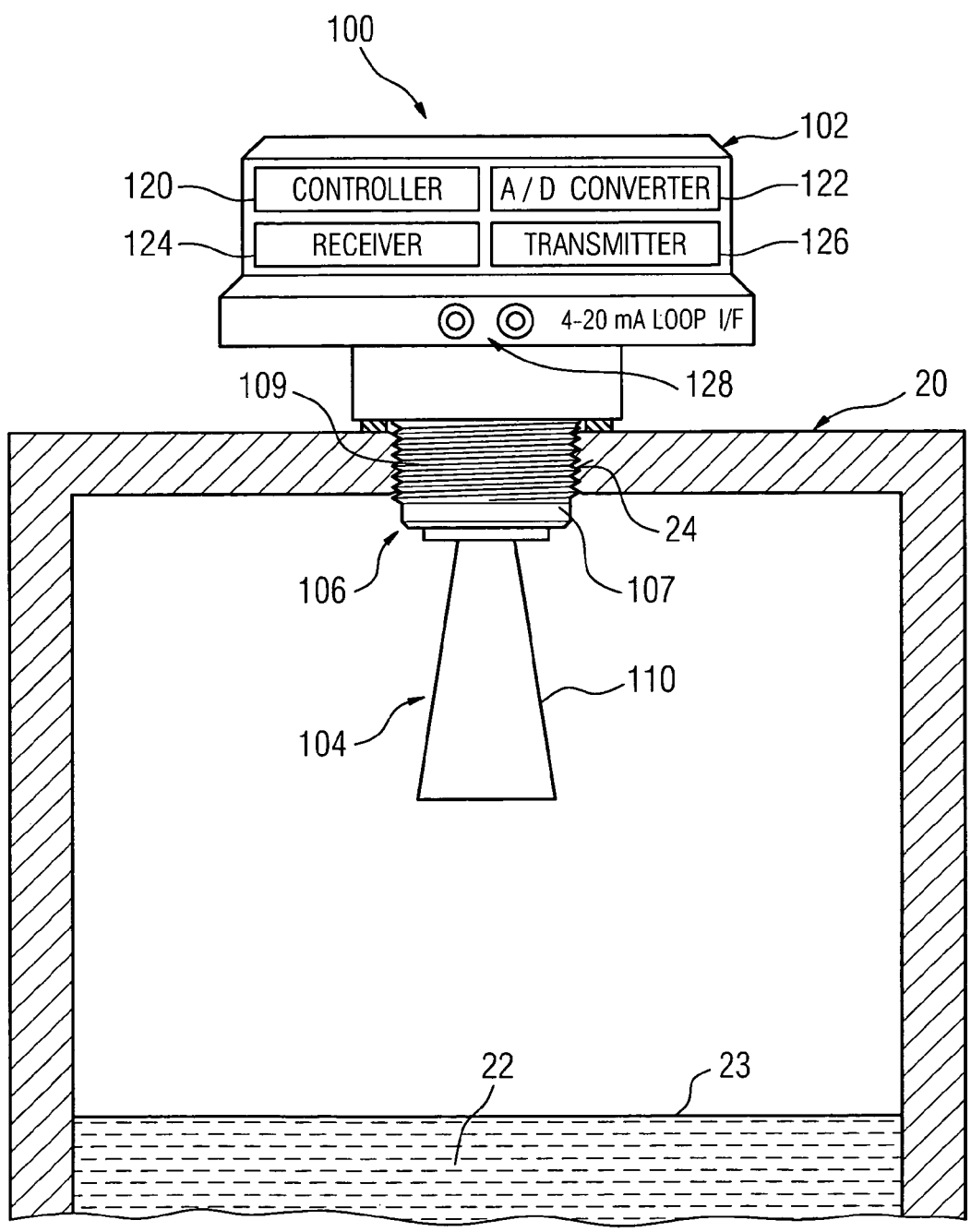
FIG. 1 shows in diagrammatic form a radar-based level measurement system incorporating a shielded mounting unit according to the present invention.

Reference is first made to FIG. 1 which shows in diagrammatic form a radar-based or a microwave-based level measurement apparatus 100 with a shielded mounting module in accordance with the present invention.

As shown in FIG. 1, the level measurement apparatus 100 is mounted on top of a container or vessel 20 which holds a material 22, e.g. liquid, slurry or solid. The level measurement apparatus 100 functions to determine the level of the material 22 held in the vessel 20. The level of the material 22 is defined by a top surface, denoted by reference 23, which provides a reflective surface for reflecting electromagnetic waves or energy pulses. The vessel or container 20 has an opening 24 for mounting the level measurement apparatus 100.

The level measurement apparatus 100 comprises a housing member or enclosure 102, and an antenna assembly 104. The housing 100 contains electronic circuitry. The electronic circuitry comprises a radar board (indicated by reference 200 in FIG. 2) with a shielded mounting module as described in more detail below. The antenna assembly 104 extends into the interior of the vessel 20 and comprises an antenna 110 (i.e. waveguide). The antenna assembly 104 may comprise a horn antenna (as shown in FIG. 1) or a rod antenna (not shown). The horn antenna 110 is typically used in applications where there are space or height restrictions or limitations in the vessel 20.

The level measurement apparatus 100 has a mounting mechanism 107 which couples the apparatus 100 to the opening 24 on the vessel 20. The mounting mechanism 107 may comprise a threaded collar 109 which is screwed into a corresponding threaded section in the opening 24 on the vessel 20. It will be appreciated that other attachment or clamping devices, for example, a flanged connector mechanism, may be used to secure the level measurement apparatus 100 to the opening 24 and/or vessel 20 as will be familiar to those skilled in the art. The antenna assembly 104, or the antenna 110, is coupled to the mounting mechanism 107.

The electronic circuitry comprises the radar board 200 (FIG. 2) and may include one or other circuit boards (not shown). The radar board 200 includes, as depicted in FIG. 1, a controller 120 (for example a microcontroller or microprocessor), an analog-to-digital (A/D) converter 122, a receiver module 124 and a transmitter module 126. The electronic circuitry for the level measurement device 100 may also include a current loop interface (4-20 mA) indicated by reference 128. The receiver module 124 and the transmitter module 126 are components of the high frequency circuit and are mounted and shielded by the shielded mounting module as described in more detail below with reference to FIG. 2.

Figure 2:
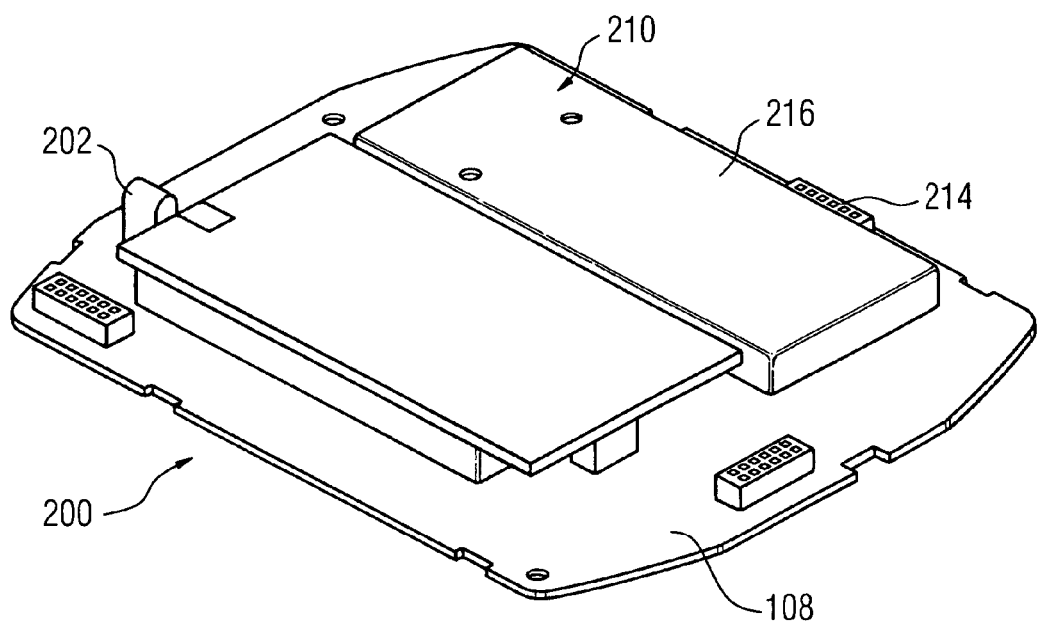
FIG. 2 shows a printed circuit board module with a shielded mounting module according to the present invention.

Reference is next made to FIGS. 2 to 4, which show the radar board 200 and the shielded mounting module in greater detail. In FIG. 2 (and FIGS. 3-4), the radar board and the shield mounting module are indicated generally by references 200 and 210, respectively. As shown, the radar board 200 includes a bidirectional port 202 for connecting to the antenna 104. The bidirectional port 202 may be implemented utilizing a coaxial connector and a coaxial cable, i.e. waveguide, for coupling the antenna assembly 104. It will be appreciated that the bidirectional port 202 may be implemented using other types of waveguides or coupling mechanisms.

As shown in FIGS. 3 and 4, the shielded mounting module 210 includes a bidirectional connection port 212 for coupling to the circuit side of the bidirectional port 202. The bidirectional connection port 212 may be implemented using a coaxial coupler and a coaxial cable connected to the port 212 and the bidirectional port 202. The shielded mounting module 210 also includes another connection port indicated by reference 214. The connection port 214 provides a bidirectional port for connecting the non-high frequency electronic circuitry on the radar board 200, for example, to the controller 120 (FIG. 1), the A/D converter 122 (FIG. 1). The non-high frequency circuitry may also include a receiver interface module and a transmitter interface module for interfacing the controller 120 to the receiver module 124 and the transmitter module 126, respectively, mounted in the high frequency shielded mounting module 210. The receiver interface module provides an interface between the controller 120 and the high frequency receiver module 124 and functions to convert the signals (e.g. echo signals) received from the antenna 104 to a level suitable for processing by the controller 120. The transmitter interface module provides an interface between the controller 120 and the high frequency transmitter module 126 (in the high frequency shielded mounting module 210) and functions to convert the signals (e.g. pulse control signals) generated by the controller 120 for the transmitter module 126.

Referring to FIG. 1, the controller 120 uses the transmitter module 126 to excite the antenna 104 with electromagnetic energy in the form of radar pulses or continuous radar waves. The electromagnetic energy, i.e. guided radio frequency waves, is transmitted to the antenna 104 through the bidirectional port 202 and coaxial cable or waveguide coupled to the antenna 104. The antenna 104 converts the guided waves into free radiating waves which are emitted by the antenna 104 and propagate in the vessel 20. The electromagnetic energy, i.e. reflected free radiating waves, reflected by the surface 23 of the material 22 contained in the vessel 20 is coupled by the antenna 104 and converted into guided electromagnetic signals which are transmitted through the waveguide back to the receiver module 124. The electromagnetic signals received from the antenna 104 are processed and then sampled and digitized by the A/D converter 122 for further processing by the controller 120. The controller 120 executes an algorithm which identifies and verifies the received signals and calculates the range of the reflective surface 23, i.e. based on the time it takes for the reflected pulse (i.e. wave) to travel from the reflective surface 23 back to the antenna 104. From this calculation, the distance to 25 the surface 23 of the material 22 and thereby the level of the material, e.g. liquid 22 in the vessel 20, is determined. The controller 120 also controls the transmission of data and control signals through the current loop interface 128. The controller 120 is suitably programmed to perform these operations as will be within the understanding of those skilled in the art. These techniques are described in prior patents of which U.S. Pat. No. 4,831,565 and U.S. Pat. No. 5,267,219 are exemplary.

The antenna assembly 104 transmits electromagnetic signals (i.e. free radiating waves) onto the surface 23 of the material 22 in the vessel 20. The electromagnetic waves are reflected by the surface 23 of the material 22, and an echo signal is received by the antenna assembly 104. The echo signal is processed using known techniques, for example, as described above, to calculate the level of the material 22 in the vessel 20.

Reference is made to FIGS. 3 and 4, which show the high frequency shielded mounting module 210 in further detail. The high frequency shielded mounting module 210 is formed from a metal sheet material or other suitable electrically conductive material. As shown, the shielded mounting module 210 provides a shielded enclosure or cavity which includes a cover member or top member 216 (as also shown in FIG. 2). The shielded mounting module 210 functions to suppress EMI (electromagnetic interference). As shown in FIGS. 3 and 4, the bottom surface of the mounting module 210 includes a number of mounting bosses or dimples 220, indicated individually by references 220a, 220b, 220c and 220d. According to this aspect, the bosses 220 serve two functions. First, each of the bosses 220 provides a solder connection surface to corresponding solder pads or tracks 222, indicated individually by references 222a, 222b, 222c and 222d, on the radar board 200 as shown in FIG. 3. To provide the shielding function, the solder pads 222 on the radar board 200 are connected to ground. The solder pads 222 may also comprise apertures or openings for receiving the bosses 220 and having an electrical connection, for example, a pad or track, which is coupled to ground. Second, each of the bosses 220 also functions as a spacer or stand-off to mount the module above the surface of the radar board 200.

According to this aspect, the bosses 220 are extruded or formed as an integral component of the shielded mounting module 210. For example, the shielded mounting module 210 may be constructed as two components: the top member 216 and a rectangular or square box member 218. The bosses 220 are stamped or extruded in the bottom surface of the box member 218 for example by the die which cuts the blank for the box member 218. In another embodiment, the bosses 220 are replaced by two or more rail members 230, indicated individually by references 230a and 230b, and shown in broken outline in FIG. 3. To provide a solder surface and contact point, each of the bosses 220 has a flattened bottom surface, for example, indicated by reference 221a in FIG. 3. Similarly, the rail members 230a and 230b each have a flattened bottom surface indicated by references 231a and 231b, respectively. In another embodiment, the rail members 230 may comprise one or more linear sections.

What is claimed is:

1. A shielded compartment for mounting a high frequency radar component on a printed circuit board, said shielded compartment comprising:
   a cover member formed from a conductive material;
   a box member formed from a conductive material and comprising a bottom member and a plurality of side members, the respective conductive material of said bottom member and said side members in combination with the respective conductive material of the cover member forming an electromagnetically shielded cavity for the high frequency radar component;
   a plurality of extruded mounting elements extending from a surface of the bottom member for mounting the shielded compartment to the printed circuit board; and
   said extruded mounting elements being formed in the bottom member of said box member and providing solder surfaces for affixing to respective contact pads on the printed circuit board, wherein each of the contact pads is couple to an electrical ground to provide shielding to the shielded compartment, wherein said mounting elements further provide a spaced-apart relationship between the surface of the bottom member and a corresponding surface of the printed circuit board.

2. The shielded compartment as claimed in claim 1, wherein said mounting elements comprise extruded bosses.

3. The shielded compartment as claimed in claim 1, wherein said mounting elements comprise at least one pair of rails.

4. The shielded compartment as claimed in claim 1, wherein said box member is formed of a metal sheet material.

5. The shielded compartment as claimed in claim 4, wherein said mounting elements are stamped or extruded in the bottom surface of the box member.

6. A shielded compartment for mounting a high frequency radar component on a printed circuit board, comprising:
   a cover member formed from a conductive material; and
   a box member formed from a conductive material, comprising:
      a bottom member having a plurality of extruded mounting elements that extend from a surface of the bottom member for mounting the shielding compartment to the printed circuit board and formed in the bottom member to provide solder surfaces for affixing to contact pads on the printed circuit board, wherein each of the contact pads is coupled to and electrical ground to provide shielding to the shielded compartment, wherein said mounting elements further provide a space-apart relationship between the surface of the bottom member and a corresponding surface of the printed circuit board,
      a plurality of side members,
   wherein the respective conductive material of the bottom member and the side members in combination with the respective conductive material of the cover member form an eletromagnetically shielded cavity that houses the high frequency radar component.

7. The shielded compartment as claimed in claim 6, wherein the mounting elements comprise extruded bosses.

8. The shielded compartment as claimed in claim 7, wherein the mounting elements are stamped or extruded in the bottom surface of the box member.

9. The shielded compartment as claimed in claim 8, wherein the box member is formed of a metal sheet material.

10. The shielded compartment as claimed in claim 6, wherein the mounting elements comprise at least one pair of rails.

11. The shielded compartment as claimed in claim 10, wherein the mounting wherein the mounting elements are stamped or extruded in the bottom surface of the box member.

12. The shielded compartment as claimed in claim 11, wherein the box member is formed of a metal sheet material.

13. The shielded compartment as claimed in claim 6, wherein the box member is formed of a metal sheet material.

14. The shielded compartment as claimed in claim 6, wherein the mounting elements are stamped or extruded in the bottom surface of the box member.

* * * * *